United States Patent
Deboy (10) Patent No.: US 6,664,590 B2
(45) Date of Patent: Dec. 16, 2003

(54) CIRCUIT CONFIGURATION FOR LOAD-RELIEVED SWITCHING

(75) Inventor: Gerald Deboy, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/210,664

(22) Filed: Aug. 1, 2002

(65) Prior Publication Data

US 2003/0025124 A1 Feb. 6, 2003

(30) Foreign Application Priority Data

Aug. 1, 2001 (DE) .......................................... 101 37 676

(51) Int. Cl.[7] .......................... H01L 29/76; H01L 29/94; H01L 31/062; H01L 31/113; H01L 31/119
(52) U.S. Cl. ........................ 257/328; 257/335; 257/336; 257/337; 257/341
(58) Field of Search ................................. 257/328, 335, 257/336, 337, 341

(56) References Cited

U.S. PATENT DOCUMENTS

| 6,587,359 B2 | * | 7/2003 | Raets et al. ................... 363/24 |
| 2002/0096970 A1 | * | 7/2002 | Hayashi et al. ........ 310/316.02 |
| 2002/0191419 A1 | * | 12/2002 | Asano et al. .................. 363/17 |
| 2003/0002304 A1 | * | 1/2003 | Zhu et al. ................. 363/56.02 |
| 2003/0058663 A1 | * | 3/2003 | Bennett ........................ 363/40 |

FOREIGN PATENT DOCUMENTS

| DE | 199 23 466 A1 | 11/2000 |
| DE | 199 46 167 A1 | 4/2001 |

OTHER PUBLICATIONS

Saro, L. et al.: "High–Voltage MOSFET Behavior in Soft-Switching Converter: Analysis and Reliability Improvements", Proceedings INTELEC, 1999.

* cited by examiner

Primary Examiner—Ngân V. Ngô
(74) Attorney, Agent, or Firm—Laurence A. Greenberg; Werner H. Stemer; Gregory L. Mayback (57) ABSTRACT

A circuit configuration for load-relieved switching has a bridge circuit with at least two controllable power switches, whose controlled paths are arranged in series with one another and between a first and a second supply potential. The circuit configuration has a drive circuit for driving the power switches, and an inductive element that is connected to output terminals of the bridge circuit. At least one power switch is designed as a field-effect-controllable, integrated transistor in accordance with the principle of charge carrier compensation or at least one power switch has deep pn junctions.

36 Claims, 11 Drawing Sheets

CIRCUIT CONFIGURATION FOR LOAD-RELIEVED SWITCHING

BACKGROUND OF THE INVENTION

Field of the Invention

The invention relates to a circuit configuration for load-relieved switching having a bridge circuit with at least two-controllable power switches, whose controlled paths are arranged in series with one another and between a first and a second supply potential. The circuit configuration has a drive circuit for driving the power switches. The circuit configuration also has an inductive element that is connected to the output terminals of the bridge circuit.

The article by Leo Zaro et al. "High-Voltage MOSFET Behavior in Soft-Switching Converters: Analysis and Reliability Improvements", in Proceedings INTELEC, 1999, pages 30–40, describes a generic circuit for voltage-relieved switching that is designed as a full-bridge circuit with four power switches.

In power switches, it is possible, in principle, to distinguish between two different types of power loss. First, there is the power loss during the "on phase", during which the power switch is switched on or controlled at a low impedance. These losses essentially result from the voltage that is dropped as a result of a current flow in the channel region of the semiconductor switch. Second, there also exist switching losses that are caused by the reciprocal switch-on and -off operation of the power switch, that is to say when a high current density and a high voltage are simultaneously present at the power switch. However, these losses are incurred only during very short time intervals during switch-on and during switch-off. However, as the switching frequency rises and/or as the power to be switched increases, these switching-dictated losses increasingly gain in importance for the total power loss balance.

Therefore, development turns toward circuit concepts that reduce such switching losses by a suitable choice of the switching conditions. One such concept is what is referred to in the relevant technical literature as "Zero Voltage Switching" (ZVS). The corresponding circuits are also referred to as resonant circuits or as circuits for zero voltage or voltage-relieved switching. In the case of such circuit configurations, the semiconductor switch is switched on or off at a point in time at which no voltage or only a small voltage is present at the switch. In this case, the semiconductor switch must ideally accept no commutation current at all from other circuit sections, as a result of which, switch-on losses can be disregarded here. During the switch-off operation, care is taken to ensure that the voltage rise at the component is delayed in such a way that the maximum current density and the maximum voltage are not present simultaneously at the power switch at any point in time.

The basic construction and the method of operation of a circuit configuration for load-relieved switching that is designed as a PWM converter are described in detail in the article by Zaro et al. cited in the introduction. The circuit topology described by Zaro et al. in FIG. 1 therein includes a full bridge with four MOSFETs S1–S4 and an inductive element in the center of the bridge. What is problematic in this case is that, when very high powers will be switched, using conventional MOSFETs for such circuit topologies leads to the functional failure of the circuit.

Figure 9:
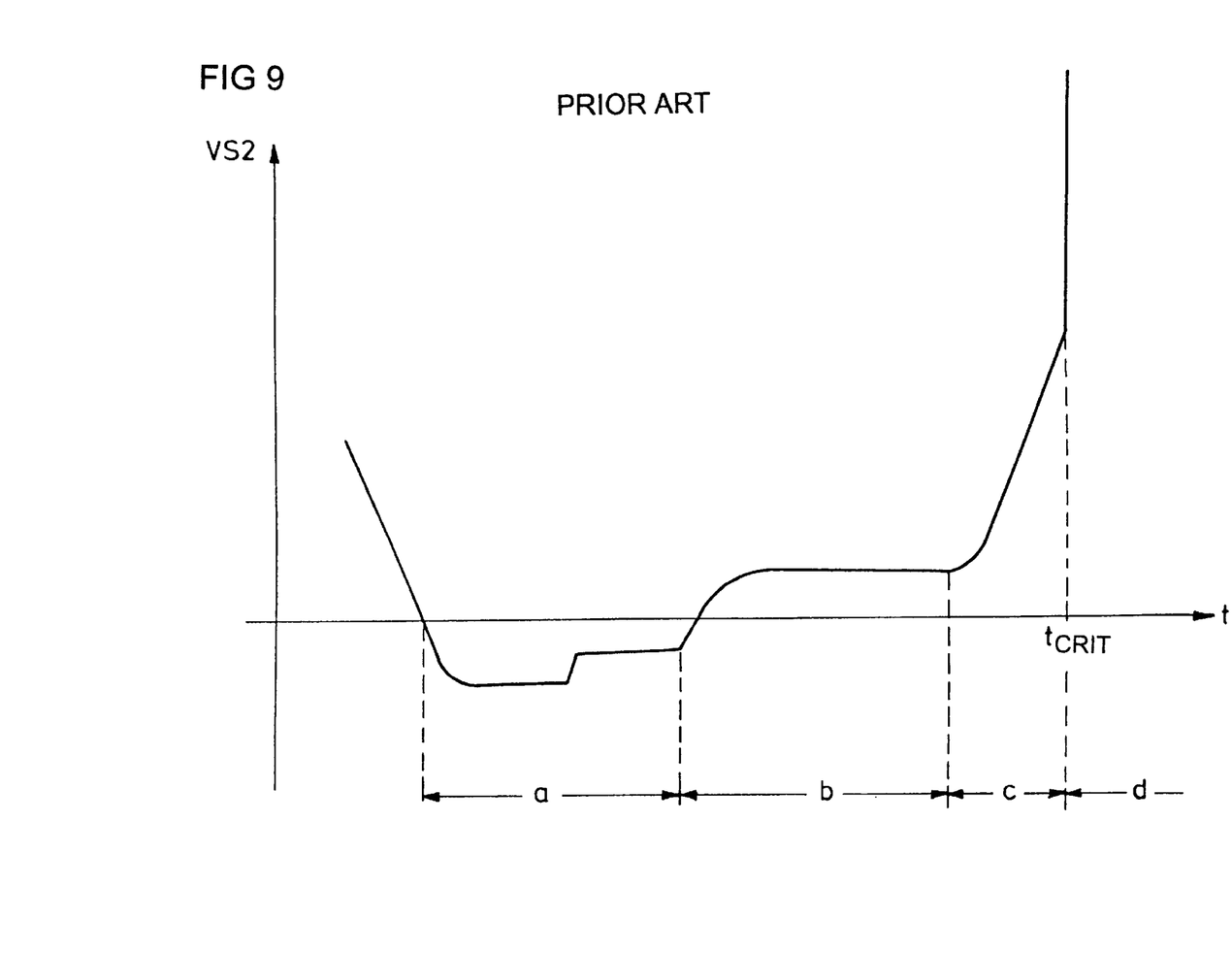
FIG. 9 shows the temporal profile of the drain-source voltage of a conventional MOSFET.
Figure 10:
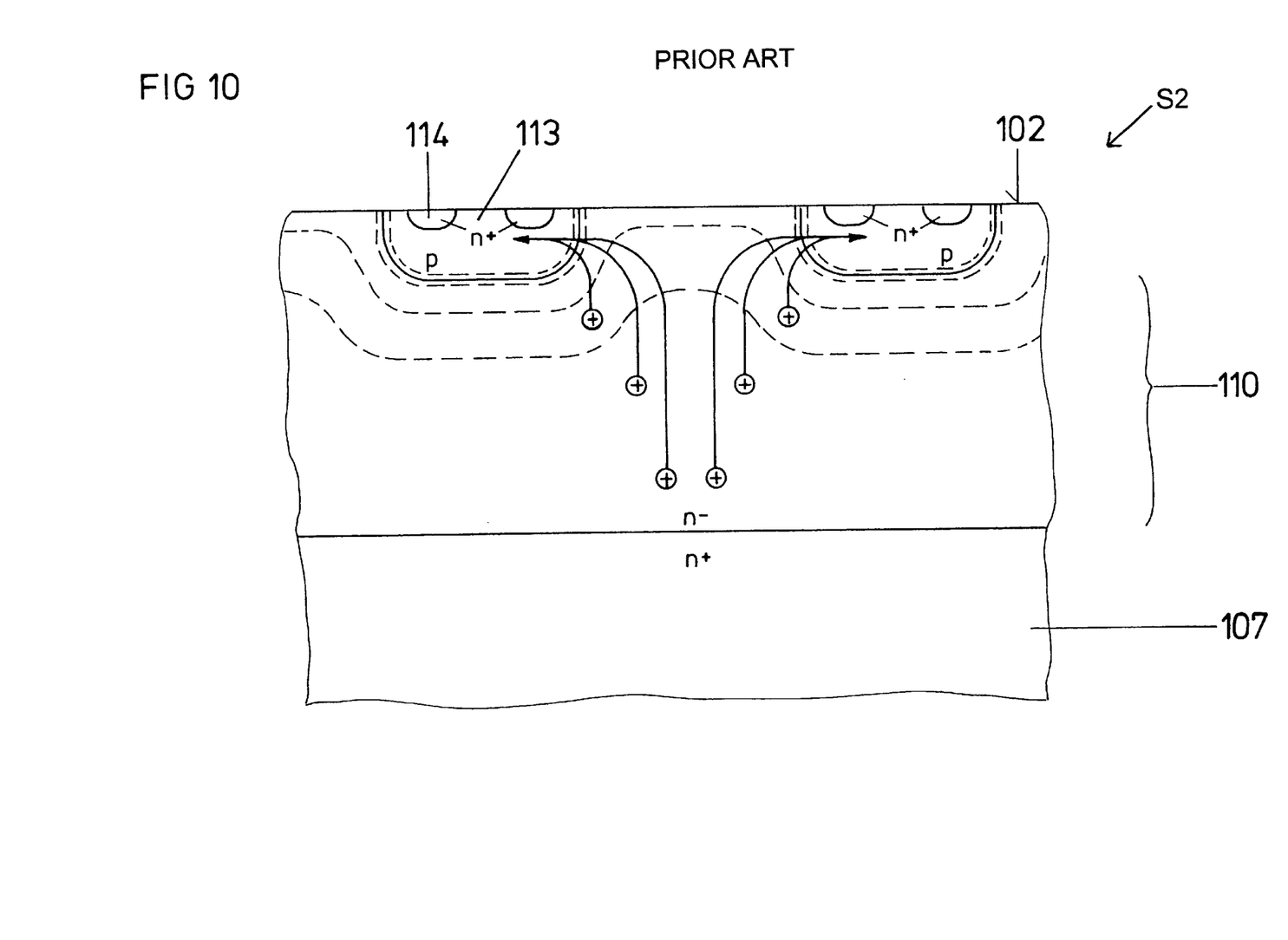
FIG. 10 is a diagrammatic partial sectional view through a conventional, vertical MOSFET.

This destruction mechanism will be illustrated with reference to FIGS. 9 and 10. FIG. 9 shows the temporal profile of the drain-source voltage VS2 at the MOSFET S2 and FIG. 10 shows a diagrammatic partial section through a vertical MOSFET that is typically used for this. The destruction mechanism is caused by an injection of storage charge into the drift region of the reverse-biased MOSFET S2, which is dissipated only very slowly (phase a). During a subsequent turn-off (phase b) of the MOSFET S2—for example after a few microseconds—the storage charge still present in the volume of the drift region 110 leads to an excessively increased hole current (phase c) to the source terminal, which results in a voltage drop in the body zone 113 of the MOSFET. If the voltage drop VS2, at the instant $t_{crit}$, exceeds the switch-on voltage of a parasitic diode at the pn junction between the base zone and the drain zone, then the parasitic bipolar transistor that is always inherent in a MOSFET and whose emitter, base and collector are formed by the source zone 114, base zone 113 and drain and drift zone 110, 107 is undesirably switched on (phase d). This undesirable switch-on of the parasitic bipolar transistor is also referred to as the latch-up effect or the "second breakdown". In such a case, the reverse voltage of the semiconductor component falls very rapidly, which typically leads to the direct destruction of the semiconductor component itself. This latch-up effect is intensified by the fact that the voltage breakdown, promoted by the curvature of the pn junction between the base zone 113 and the drift zone 110, generally occurs at the edge of the base zone 113, since the hole current flows from the volume of the semiconductor body principally via the lateral pn junction into the base zone 113, so that the high current density arises there.

Figure 11:
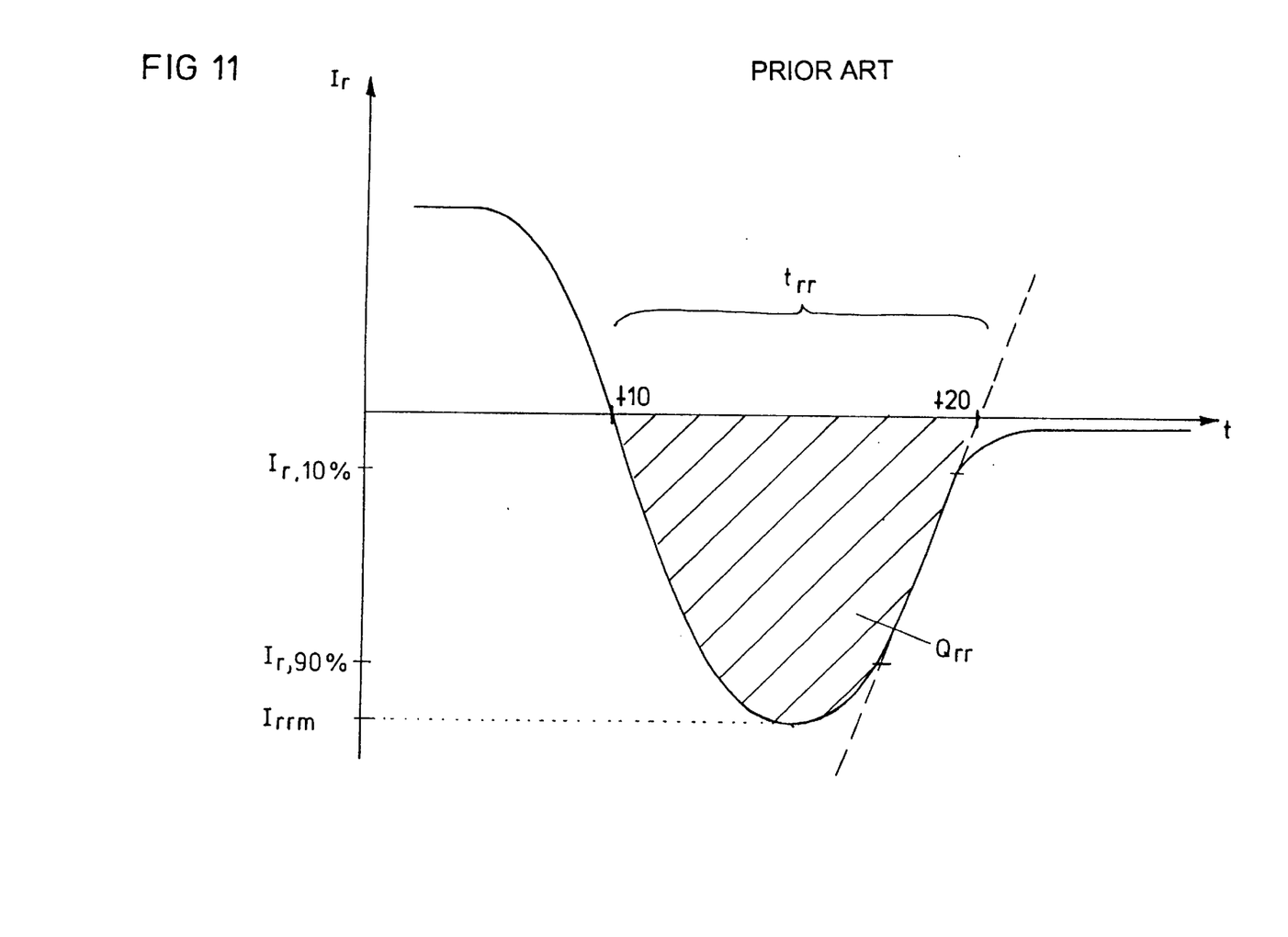
FIG. 11 shows the temporal profile of the load current $I_r$ in a conventional MOSFET for defining the storage charge $Q_{rr}$ and the recovery time $t_{rr}$.

In the article cited in the introduction, Zaro et al. therefore arrive at the conclusion that semiconductor components in ZVS circuit topologies that have a high storage charge Qrr in the reverse operation and a correspondingly long recovery time trr are affected by precisely the destruction mechanism mentioned. FIG. 11 shows the temporal profile of the load current curve of a conventional MOSFET, which is used to define the storage charge Qrr and the recovery time trr. The storage charge Qrr results from:

$$Qrr = \int_{t10}^{t20} Ir(t)\,dt,$$

in other words the storage charge Qrr is the total quantity of the charge in the time period between t10 and t20. The instant t20 is produced by interpolating the straight line through the points $I_{r,90\%}=0.9 * I_{rrm}$ and $I_{r,10\%}=0.1 * I_{rrm}$, where $I_{rrm}$ denotes the minimum load current Ir. The recovery time is then defined as:

$$trr = t20 - t10.$$

In their article, the authors recommend that transistors with high storage charge Qrr and long recovery time trr not be used in ZVS circuit topologies, in particular in ZVS bridge circuits. This recommendation by the authors that is expressed in the cited article has been followed hitherto by manufacturers and customers of such circuit configurations, for example, those in the equipment industry for telecommunications products. The result is that nowadays power transistors with high storage charge Qrr and high recovery time trr are scarcely used in ZVS circuits.

One possibility for alleviating the destruction mechanism is to use semiconductor components in which irradiation is performed in order to reduce the charge carrier lifetime. On account of the recombination centers distributed in the space charge zone of the semiconductor component, this measure leads to faster discipation of the charge carriers injected into the drift zone even when no electric field is present. However, the irradiation destroys the semiconductor crystal, which adversely affects the on resistance $RDS_{on}$, the blocking capability or the threshold voltage of the semiconductor component, depending on the type of irradiation. The impairment, i.e. the increase in the on resistance $RDS_{on}$, should be avoided, however, particularly in the case of power components, since high on resistances result in a high power loss in the switched-on state of the semiconductor component. Furthermore, in the case of a short duration between the forward biasing of the current and its turn-off, it does not suffice, even with using the irradiation technique, to dissipate the storage charge contained in the drift zone in such a way that a latch-up effect as described above is avoided. Therefore, the irradiated semiconductor components mentioned are suitable only to a limited extent for ZVS circuit topologies that have to be designed for very high reverse voltages.

Thus, ZVS circuit topologies or ZVS bridge circuits which, on the one hand, are functional in the case of high storage charges and, on the other hand, also have an optimum on resistance have not existed heretofore.

SUMMARY OF THE INVENTION

It is accordingly an object of the invention to provide a circuit configuration for load-relieved switching which overcomes the above-mentioned disadvantages of the prior art apparatus of this general type.

In particular, it is an object of the invention to provide a functional circuit configuration, in particular a bridge circuit, for load-relieved switching whose power switches have an on resistance that is as low as possible.

Accordingly, circuit configurations for load-relieved switching of the generic type are provided which are characterized in that: at least one of the power switches is designed as a field-effect-controllable, integrated transistor operating according to the principle of charge carrier compensation, or the transistor has deep pn junctions.

By modifying the transistor structure, it is possible, according to the invention, first for the total quantity of storage charge present in the semiconductor body to be reduced, and second, for the current caused by the injection of holes to be conducted to an extent in a targeted fashion by the compensation structures. In this way, in the case of circuits equipped with the inventive compensation components, despite a high storage charge $Q_{rr}$ and a relatively high recovery time $t_{rr}$, which in the case of conventional MOSFETs would lead to the destruction of the MOSFET and thus to the functional failure of the circuit, this destruction mechanism is avoided. The experts' prejudice, set forth in the article cited in the introduction, which describes the destruction mechanism of a conventional MOSFET when used in a full-bridge circuit, is refuted by the structural modification of the MOSFET. The structural modification can be effected first in providing power switches according to the principle of charge carrier compensation. The compensation components provided for this purpose are additionally distinguished, compared with conventional MOSFETs, by the fact that they have a very low on resistance $RDS_{on}$, and consequently, significantly lower power losses in operation. Second, the structural modification can relate to providing power switches with deep pn junctions. Deep pn junctions are understood to be such structures when the extent of the body zone and regions coupled to the body zone, from the first surface of the semiconductor body to the drain region, amounts to more than 30% —preferably more than 45% —of the width of the space charge zone under an applied voltage. A compensation component is such a component with deep pn junctions, since the body region and the depletion zone of the same conduction type which is connected thereto typically extend into the semiconductor body even more deeply than 50% of the width of the space charge zone.

With the foregoing and other objects in view there is provided, in accordance with the invention, a circuit configuration for load-relieved switching, that includes: a terminal for receiving a first supply potential; a terminal for receiving a second supply potential; a bridge circuit having at least two controllable power switches, the two controllable power switches having controlled paths configured in series with one another and between the first supply potential and the second supply potential, the bridge circuit having output terminals; a drive circuit for driving the two controllable power switches; and an inductive element connected to the output terminals of the bridge circuit. At least one of the two controllable power switches is designed as a field-effect-controllable, integrated transistor in accordance with a charge carrier compensation principle.

With the foregoing and other objects in view there is provided, in accordance with the invention, a circuit configuration for load-relieved switching, that includes: a terminal for receiving a first supply potential; a terminal for receiving a second supply potential; a bridge circuit having at least two controllable power switches, the two controllable power switches having controlled paths configured in series with one another and between the first supply potential and the second supply potential, the bridge circuit having output terminals; a drive circuit for driving the two controllable power switches; and an inductive element connected to the output terminals of the bridge circuit. The two controllable power switches are designed as transistors with deep pn junctions.

In accordance with an added feature of the invention, each of the two controllable power switches is designed as an enhancement-mode MOSFET.

In accordance with additional feature of the invention, each of the two controllable power switches is designed as a MOSFET.

In accordance with another feature of the invention, the MOSFET is a vertical MOSFET.

In accordance with a further feature of the invention, the MOSFET has a controlled path defined by one of the controlled paths; and the MOSFET has an integrated diode and an integrated capacitive element that are connected in parallel with one another and with the controlled path of the MOSFET.

In accordance with a further added feature of the invention, the capacitive element is a capacitor having plates; and the capacitor has a high capacitance between 40 $pF/mm^2$ and 100 $pF/mm^2$ when a voltage of 25 V is present at the plates of the capacitor.

In accordance with another added feature of the invention, a semiconductor body is provided, and the field-effect-controllable, integrated transistor is configured in the semiconductor body. At least one compensation layer is configured in the semiconductor body. The compensation layer has at least one depletion zone of a first conduction type and at least one complementary depletion zone of a second, opposite conduction type. The depletion zone and the complementary depletion zone adjoin each other and form a deep pn junction. At least one body zone of the first conduction type is embedded in the compensation layer. At least one source zone of the second conduction type is embedded in the body zone. At least one gate electrode is provided for forming a current-carrying channel in the body zone when a gate potential is applied to the gate electrode.

In accordance with an additional added feature of the invention, the compensation layer has a plurality of depletion zones of the first conduction type and a plurality of complementary depletion zones of the second conduction type; the plurality of the complementary depletion zones have a total quantity of doping; and the plurality of the depletion zones have a total quantity of doping approximately corresponding to the total quantity of the doping of the plurality of the complementary depletion zones.

In accordance with yet an added feature of the invention, the compensation layer has a plurality of depletion zones of the first conduction type and a plurality of complementary depletion zones of the second conduction type; and the plurality of the complementary depletion zones and the plurality of the depletion zones are configured alternately next to one another in the compensation layer.

In accordance with yet an additional feature of the invention, the depletion zone adjoins the base zone.

In accordance with yet another feature of the invention, there is provided, at least one drain zone of the second conduction type. The drain zone is connected to the compensation layer. The complementary depletion zone has a doping concentration, and the drain zone has a doping compensation that is greater than the doping concentration in the complementary depletion zone.

In accordance with yet a further feature of the invention, a drift zone of the second conduction type is located between the drain zone and the compensation layer. The drift zone has a doping concentration that is less than the doping concentration of the drain zone.

In accordance with an added feature of the invention, a device for lifetime lowering is provided. The device is provided in the compensation layer or the drift zone. The device reduces free charge carriers.

In accordance with an additional feature of the invention, the device for lifetime lowering is designed as scattering centers or as radiation damage that is produced by irradiation or implantation.

In accordance with another feature of the invention, the bridge circuit is designed as a full bridge, and the bridge circuit has two further controllable power switches. The two further controllable power switches have controlled paths configured in series with one another and between the first supply potential and the second supply potential.

In accordance with a further feature of the invention, a transformer is provided that has a primary-side inductance. The inductive element forms the primary-side inductance of the transformer.

In accordance with a further added feature of the invention, the bridge circuit forms a switched-mode power supply, a pulsed power supply, a voltage regulator, or a lamp drive circuit.

In accordance with a concomitant feature of the invention, a transformer is provided that has a primary inductance, formed by the inductive element, and a secondary inductance. A primary-side circuit and a secondary-side circuit are inductively coupled by the primary inductance and the secondary inductance. The primary inductance is configured in the primary-side circuit. The secondary inductance is configured in the secondary-side circuit. The bridge circuit is for pulse switching power provided on the primary-side circuit to the secondary-side circuit.

Other features which are considered as characteristic for the invention are set forth in the appended claims.

Although the invention is illustrated and described herein as embodied in a circuit configuration for load-relieved switching, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

In all the figures of the drawing, unless specified otherwise, identical or functionally identical elements and signals are provided with the same reference symbols.

Figure 1:
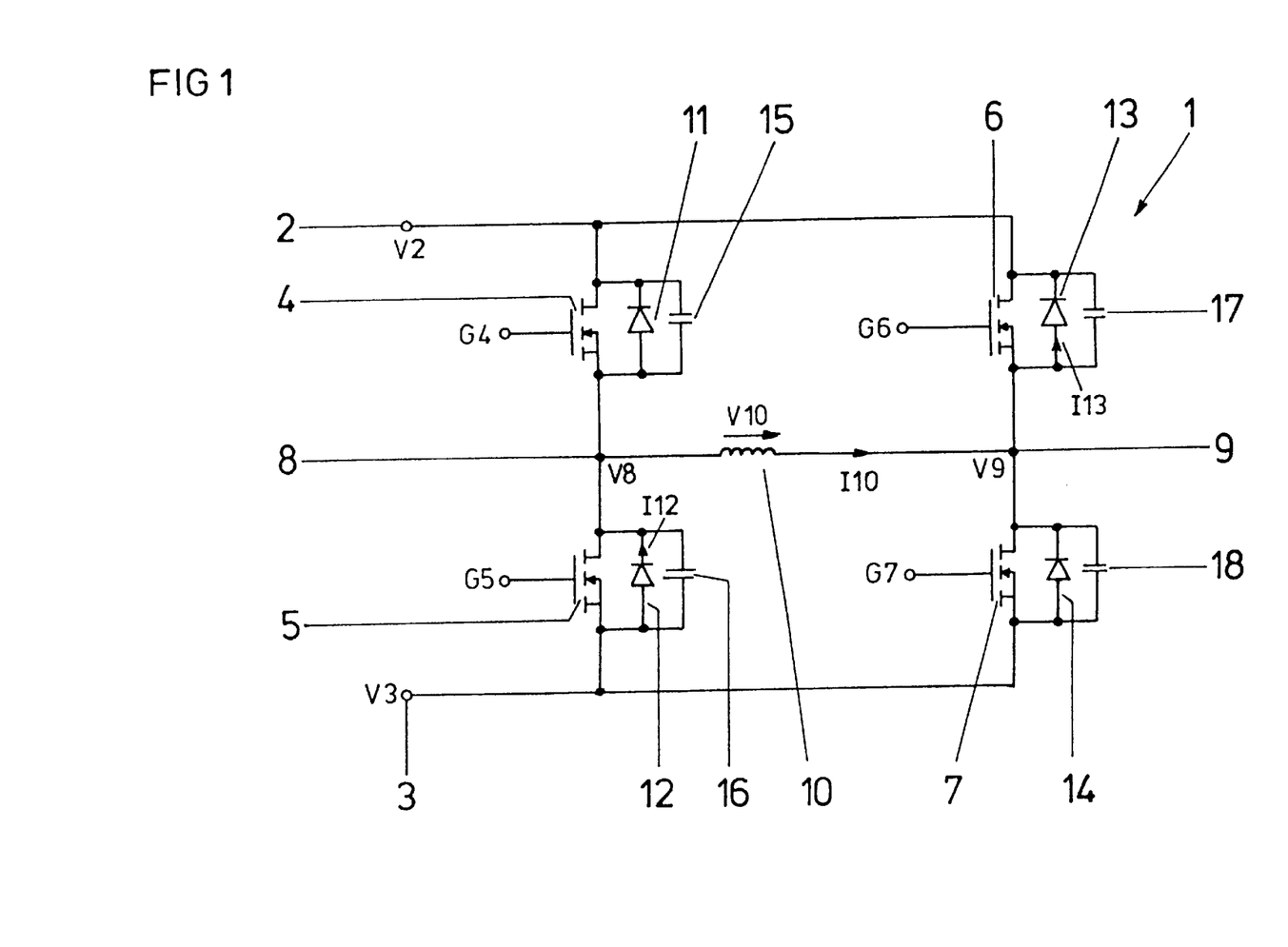
FIG. 1 shows a first exemplary embodiment of a circuit configuration designed as a full bridge.

FIG. 1 shows a first exemplary embodiment of a circuit configuration that has a full bridge designated by reference symbol 1. The full bridge 1 is arranged between two terminals 2, 3, to which a supply voltage V2–V3 can be applied. In the present case, a first supply potential V2, for example a positive supply potential, is present at the first terminal 2 and a second supply potential V3, for example a negative supply potential or the potential of the reference ground, is present at the second terminal 3. The full bridge 1 has four power switches 4–7. The controlled paths of in each case two power switches 4–7, in the present case the power switches 4, 5, on the one hand, and the power switches 6, 7, on the other hand, are connected in series with one another and between the terminals 2, 3. The center tap of the two series circuits in each case defines an output 8, 9 of the full bridge 1. The full bridge 1 furthermore contains an inductive element 10, which is arranged between the two outputs 8, 9 and couples the two outputs 8, 9 to one another. A parallel circuit including a diode 11–14 and a capacitive element 15–18 is respectively connected in parallel with each power switch 4–7.

The controllable power switches 4–7 are designed as enhancement-mode n-channel MOSFETs 4–7 in the present case. The diodes 11–14 may be, for example, the inverse diode inherent in a respective MOSFET 4–7 while the capacitive element 15–18 may be designed, for example, as a likewise concomitantly integrated buffer capacitor including the output capacitance of the transistor or an external snubber capacitance. The MOSFETs 4–7 furthermore have a control terminal G4–G7, via which the respective controlled path of the MOSFETs 4–7 is controlled. A drive circuit that is not illustrated in FIG. 1 is provided for the control of the MOSFETs 4–7.

Figure 2:
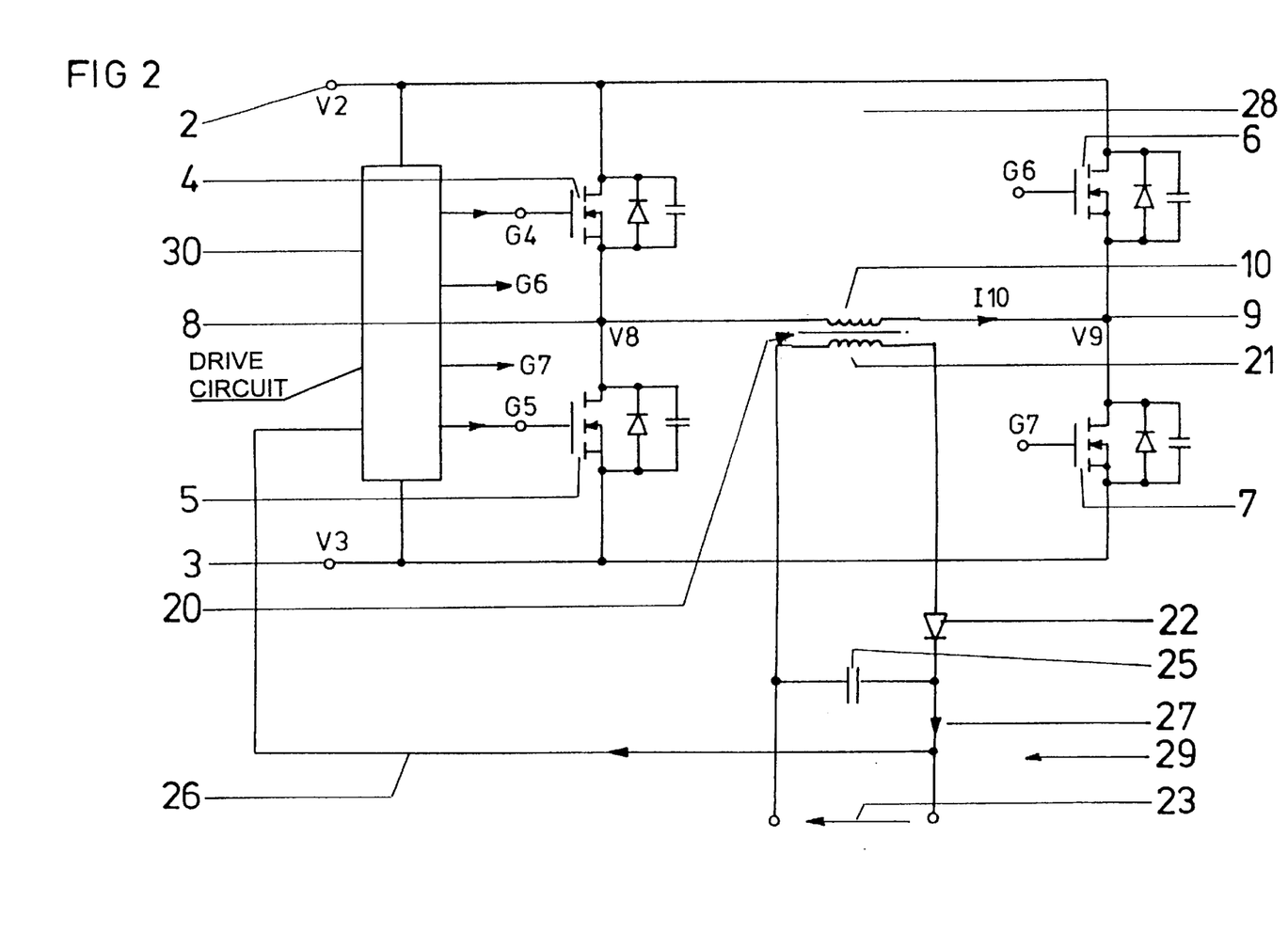
FIG. 2 shows a second exemplary embodiment of a circuit configuration in which the full bridge shown in FIG. 1 is part of a switched-mode power supply with inductive coupling.

FIG. 2 shows a second exemplary embodiment of a circuit configuration that is designed here as a switched-mode power supply with inductive coupling. The switched-mode power supply has a primary circuit 28 with the ZVS full bridge 1 and a secondary circuit 29. The circuit in FIG. 2 has been illustrated in simplified form, i.e. the illustration of the primary-side circuit sections for the provision of a drive signal and the intermediate circuit voltage has been dispensed with here, since the configuration of these circuit sections is known to the person skilled in the art in many different variants. The inductive element 10 forms here, as it were, the primary-side inductance 10 of a transformer 20. The transformer 20 furthermore has a secondary-side inductance 21 and also a diode 22 connected in series therewith. A buffer capacitor 25 is provided in parallel with the series circuit including diode 22 and inductance 21 and thus in parallel with the output of the switched-mode power supply, at which the output voltage 23 can be tapped off. The output signal 27, for example the output current, can be fed back into the primary circuit of the switched-mode power supply via a feedback path 26. The MOSFETs 4–7 are driven via a drive circuit 30 according to the current I10 flowing through the inductance 10 on the primary side, the potentials V8, V9 present at the outputs 8, 9, and also the fed-back output signal 27.

The drive circuit 30 drives the control terminals G4–G7 of the MOSFETs 4–7 in such a way that the MOSFETs 4–7 are in each case switched on and off precisely when no or no appreciable voltage is present across their controlled paths or precisely when no load current flows. Therefore, the drive circuit 30 thus drives the MOSFETs 4–7 of the full bridge 1 in such a way that they are switched in a current- or voltage-relieved manner.

According to the invention, then, preferably all of the MOSFETs 4–7, but at least those MOSFETs that are connected to the negative supply potential V3 or the potential of the reference ground, that is to say the MOSFETs 5, 7 in the present case, are designed as field-effect-controllable transistors using the principle of charge carrier compensation. The construction and the method of operation of such semiconductor components, referred to hereinafter as compensation components for short, are known in many cases and have been described for example in U.S. Pat. Nos. 5,216,275, 5,754,310, International Publication WO 97/29518, Issued German Patent Application DE 43 097 64 C2 and Issued German Patent Application DE 198 40 032 C1.

The construction of such a compensation component is explained in more detail below using four exemplary embodiments.

Figure 3:
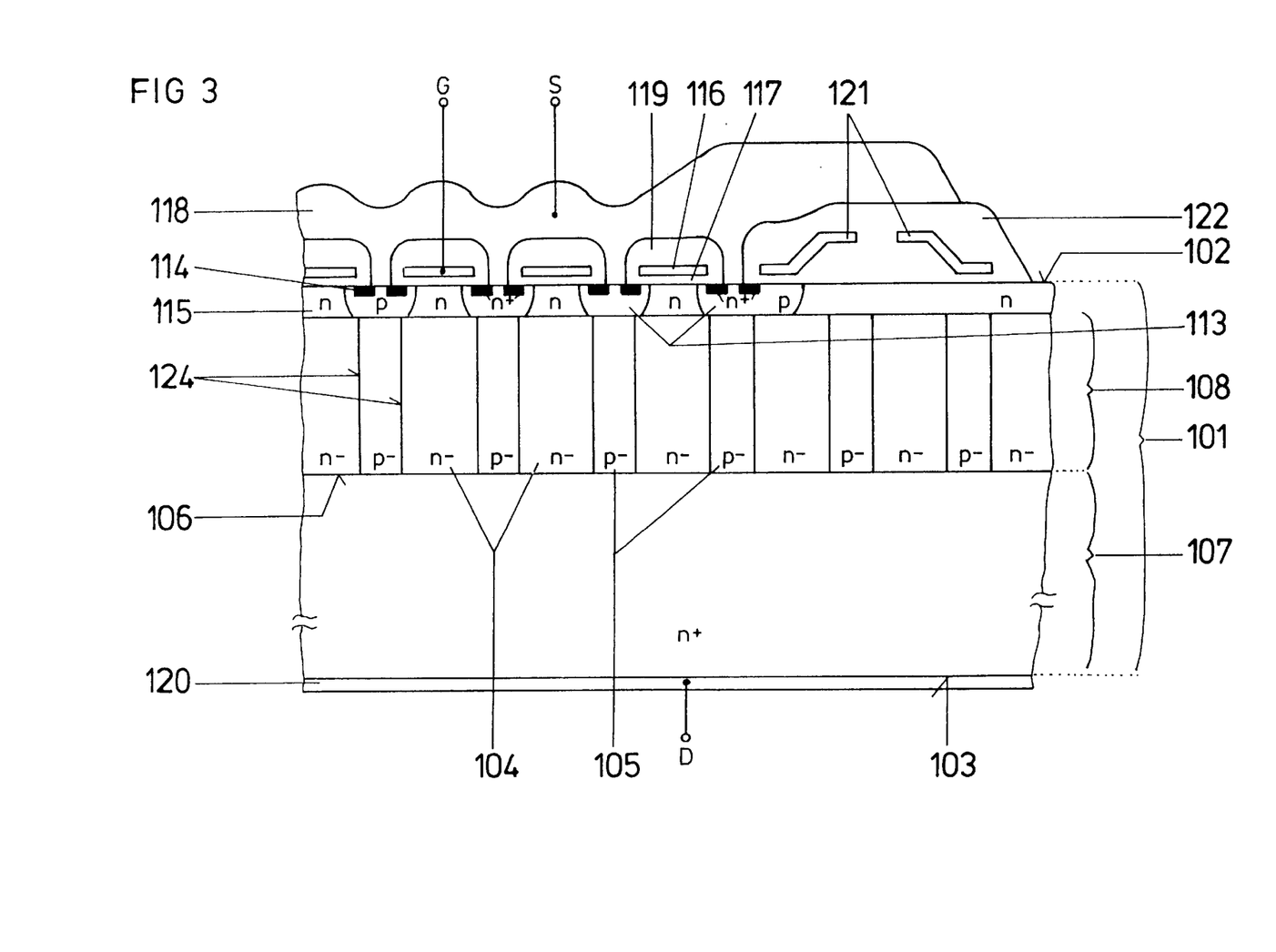
FIG. 3 is a partial sectional view of a vertical power switch designed as a MOSFET for the bridge circuits shown in FIGS. 1 and 2.

FIG. 3 shows a partial sectional view of a detail from a compensation component of vertical design, which is designed in this case as an n-channel MOSFET. In FIG. 3, 101 designates a semiconductor body—for example a monocrystalline silicon wafer. The semiconductor body 101 has a first surface 102, the so-called front side of the wafer, and a second surface 103, the so-called rear side of the wafer. The semiconductor body 101 has a heavily n-doped drain zone 107, which adjoins the surface 103 and is connected to the drain terminal D via a drain metallization layer 120 applied to the surface 103 in a large-area manner. The boundary layer 106 opposite to the surface 103 is adjoined by a compensation layer 108 of the compensation component. The compensation layer 108, which, in a compensation component, has the function of the drift path, inter alia, has doping regions 104, 105 of both conductivity types, which are arranged alternately next to one another and form the compensation structure. Hereinafter, the weakly p-doped regions 105 are also referred to as depletion zones and the weakly n-doped regions 104 as complementary depletion zones. In this case, the total quantity of the doping in the depletion zones 105 essentially corresponds to the total quantity of the doping in the complementary depletion zones 104. In the example in FIG. 3, the regions 104, 105 are designed in a laterally strip-type and vertically pillar-type manner, but a different design would also be conceivable.

At the surface 102, a plurality of p-doped body zones 113 are embedded in the compensation layer 108 in a well-type manner. One or more heavily n-doped source zones 114 are embedded in a respective body zone 113. The body zones 113 and source zones 114 can be introduced into the semiconductor body 101 in a known manner by diffusion or ion implantation and/or can be applied to the semiconductor body 101 by epitaxy. At the surface 102, the body zones 113 are spaced apart from one another by an intermediate zone 115, which is part of the complementary depletion zones 104 and thus also has the doping thereof. The p-doped body zones 113 and depletion zones 105 form pn junctions with the adjoining, n-doped intermediate zones 115 and complementary depletion zones 104. In a typical configuration, the body zones 113 project about 2 μm, and the compensation layer 108 about 40 μm, into the semiconductor body 101, so that the mutually adjoining regions 104, 105 of different conduction types define deep pn junctions 124.

Provided above each of the intermediate zones 115 is a respective gate electrode 116, which extends in a manner running laterally as far as the source zones 114. The gate electrodes 116 are insulated from the surface 102 by a thin gate oxide 117. Furthermore, a source metallization layer 118 is provided, which electrically contact-connects the source zones 114 and body zones 113 via a shunt and is spaced apart from the gate electrodes 116 by a protective oxide 119. At the front side of the semiconductor body 101, the source metallization layer 118 is connected to a source terminal S and the gate electrodes 116 are connected to a gate terminal G.

In the layout of the semiconductor body 101, the regions covered by gate electrodes 116 and also by body zones 113 and source zones 114 designate the cell array including a multiplicity of cells, and consequently, the active region of the compensation component. Each cell includes an individual transistor. Connecting the load paths of the multiplicity of individual transistors in parallel produces the MOSFET of the compensation component. A compensation component typically also has an edge region which is arranged outside the cell array, and during operation of the compensation component, is intended to ensure a defined profile of the field lines in the edge region. Field plates 121 are provided in the edge region, and are likewise insulated from the semiconductor body 101 and the source metallization layer 118 by a protective oxide 122.

The cells of the cell array and the compensation structures form a grid. In the present exemplary embodiment in FIG. 3, the regions 104, 105 are connected to the body zones 113, and the grid of the cell array is aligned with the grid of the compensation layer 108. It would also be conceivable, however, for these structures not to be aligned with one another or for the regions 104, 105 not to be connected to the structures of the cell array.

The gate electrodes 116 are typically composed of polysilicon, but they may also be composed of a different material, for example, metal or silicide, although these materials, in terms of fabrication technology and because of their physical and electrical properties, are not as advantageous as highly doped polysilicon. Equally, for the gate oxide 116 and the protective oxide 119, 122, instead of silicon dioxide ($SiO_2$) it is also possible to use any other insulating material, for example, silicon nitride ($Si_3N_4$), but thermally fabricated silicon dioxide has the highest quality, particularly when used as the gate oxide, and is therefore preferable. Aluminum or an aluminum alloy—such as, for example, AlSi, AlSiCu, or the like—is typically used as the source metallization layer 118 and the drain metallization layer 120, but in this case, too, any other highly conductive material that ensures a good contact with the semiconductor body 101 could be used.

Figure 4:
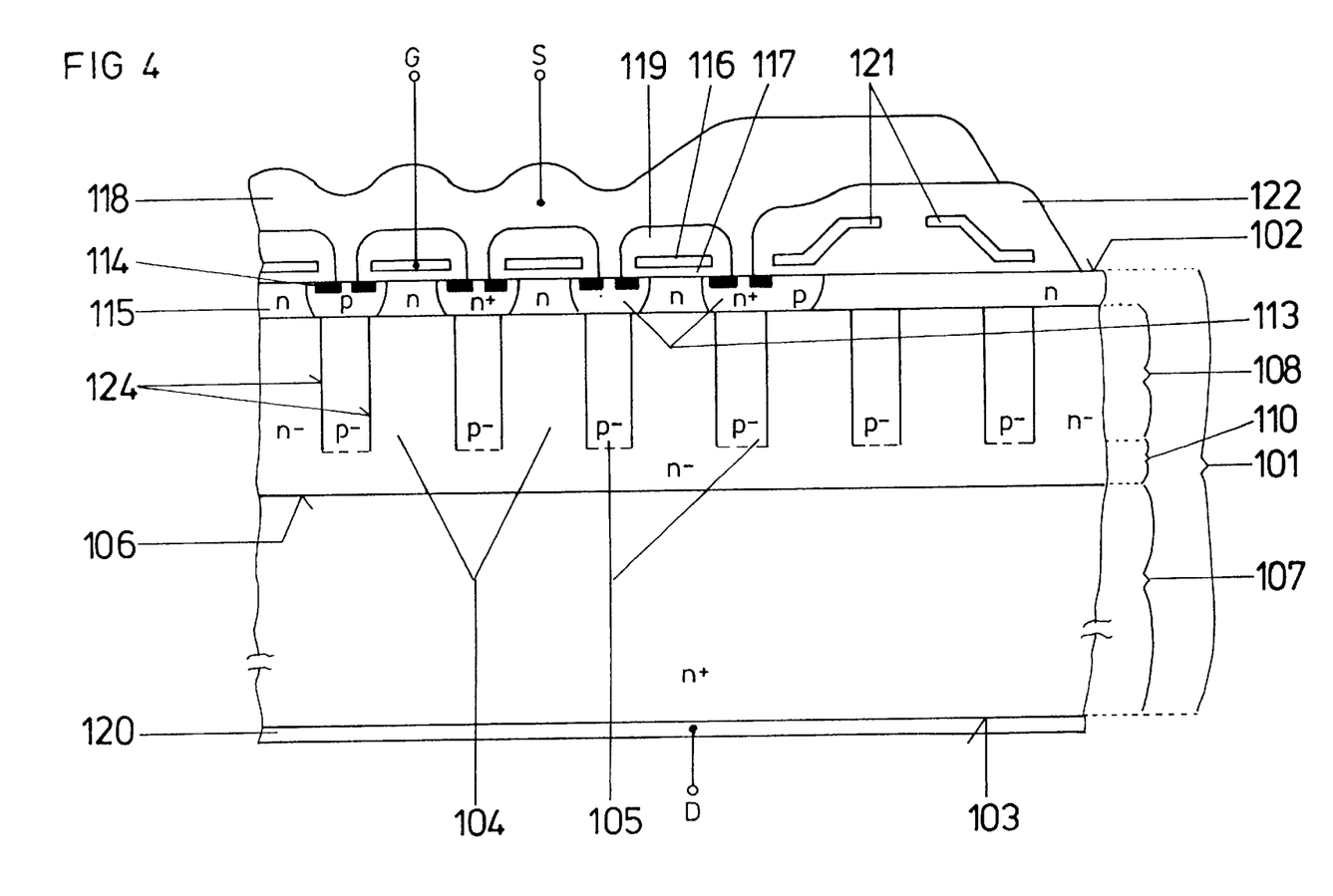
FIG. 4 is a partial sectional view of a second exemplary embodiment of a vertical power switch designed as a MOSFET.

FIG. 4 shows a partial sectional view of a second exemplary embodiment of a compensation component of a vertical design. The semiconductor component in FIG. 4 differs from the semiconductor component illustrated in FIG. 1 in terms of the construction of the compensation layer 108. Here, the depletion zones 105 and the complementary depletion zones 104 of the compensation layer 108 are not connected to the rear-side drain zone 107. In other words, a weakly n-doped drift zone 110 is arranged between the zones 104, 105. The zones 104, 105 are thus formed in a more or less floating fashion in the compensation layer 108. The semiconductor component illustrated in FIG. 4 forms the most advantageous embodiment with regard to the configuration of the compensation layer 108, in particular, for technological reasons, and this embodiment is thus preferred over the exemplary embodiment illustrated in FIG. 1 in which the compensation layer 108 is directly connected to the drain zone 107.

Figure 5:
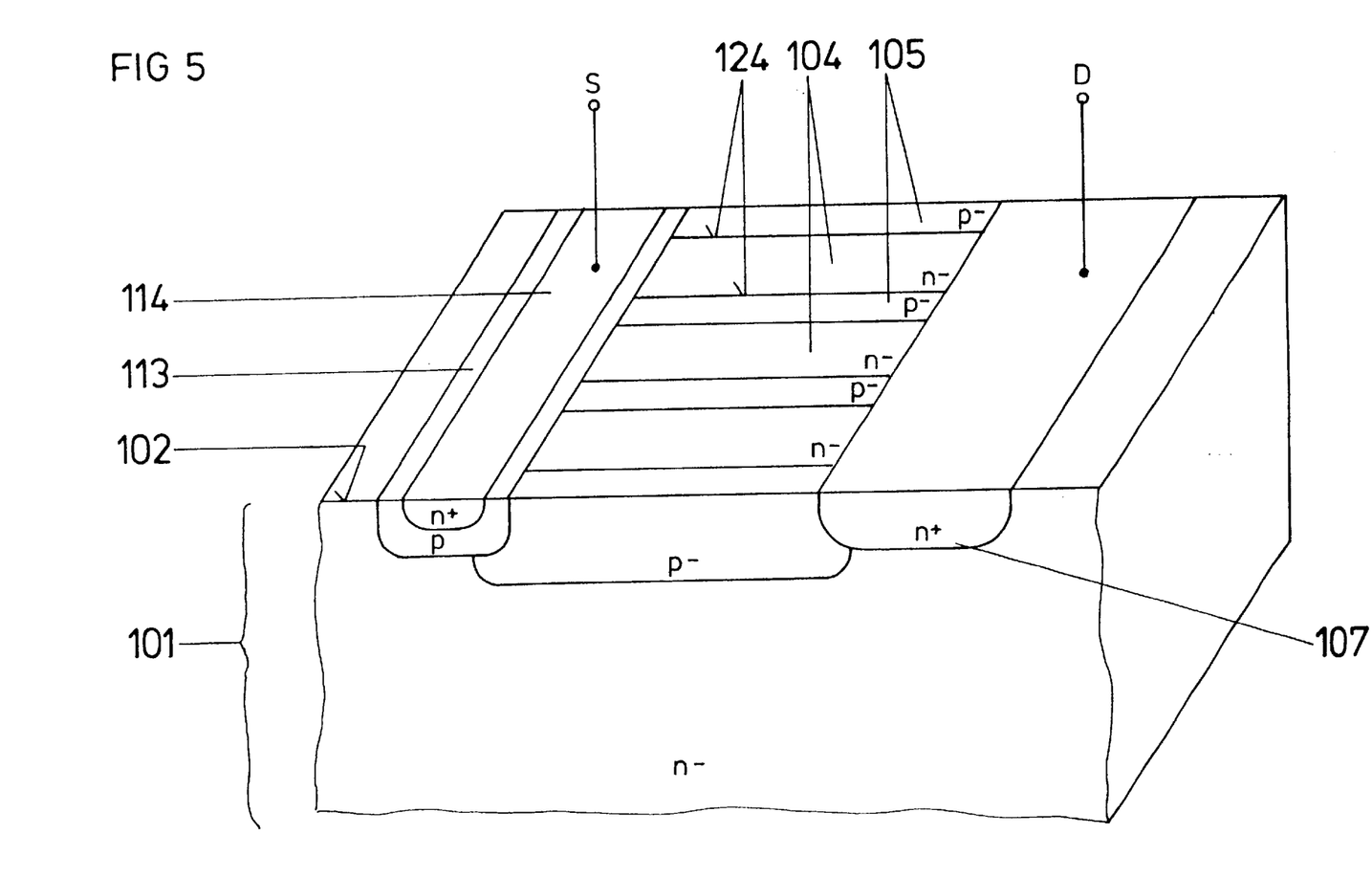
FIG. 5 is a perspective partial sectional view of a third exemplary embodiment of a lateral power switch designed as a MOSFET.

FIG. 5 shows, in perspective view, a detail from a compensation component that is of lateral design. FIG. 5 differs from the exemplary embodiments shown in FIGS. 3 and 4 by the fact that the compensation structures are arranged laterally. In this case, the drain and source electrodes D, S are situated at the same surface 102 of the semiconductor body 101, as a result of which an essentially lateral current flow near the surface is produced. The illustration of the passivation layers and electrodes arranged at the surface 102 has been dispensed with here for reasons of better clarity. In this case, the regions 104, 105 are introduced into the semiconductor body 101 in strip form.

Figure 6:
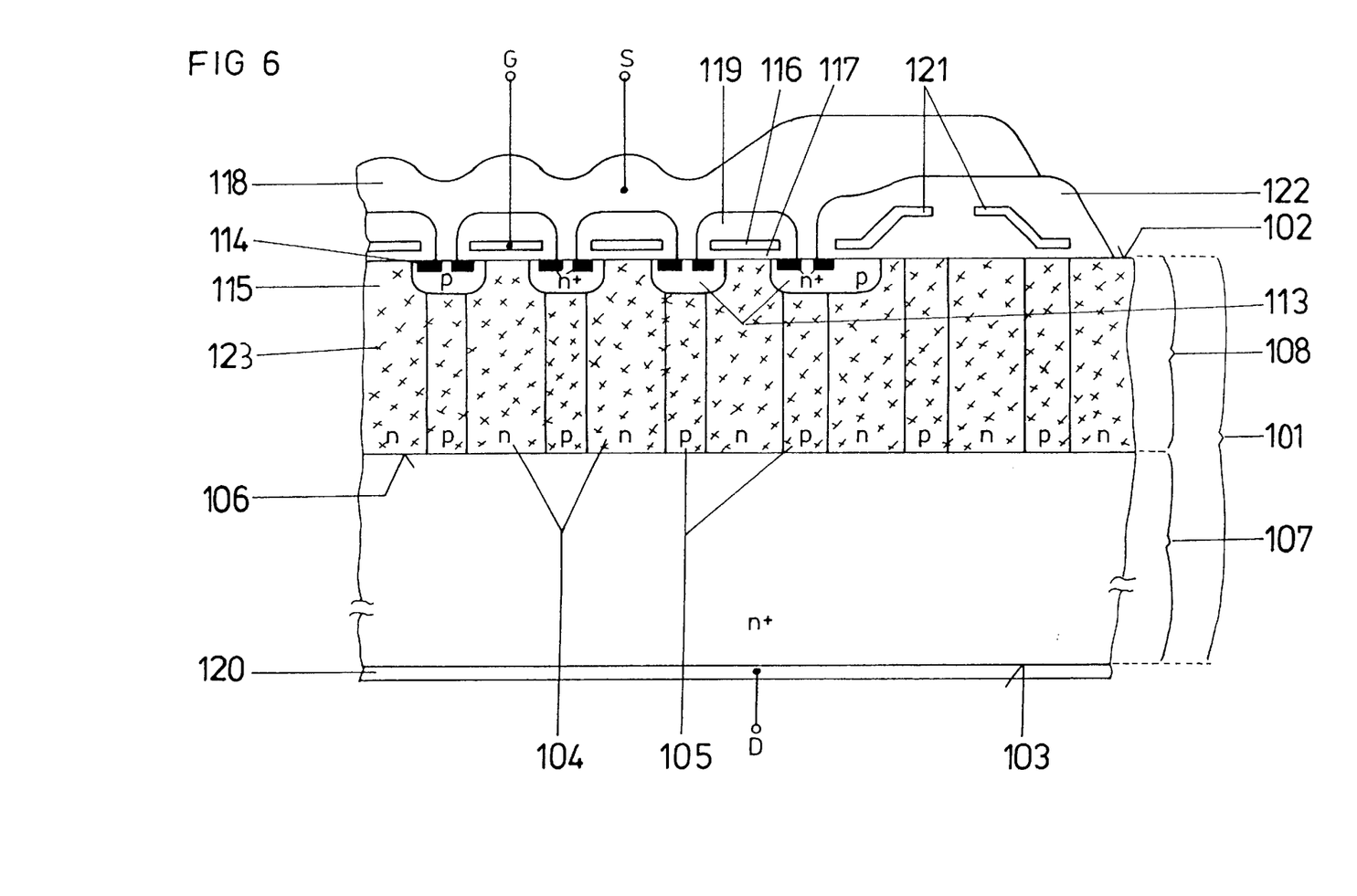
FIG. 6 is a partial sectional view of a fourth exemplary embodiment of a vertical power switch designed as a MOSFET.

FIG. 6 shows a partial sectional view of a fourth exemplary embodiment of a compensation component. In this case, the compensation layer 108 has a device, namely scattering centers or defects 123 (crosses), for reducing the injected storage charge. The defects 123 can be produced for example by irradiation or by implantation of high-energy ions or particles, e.g. electrons, protons or helium. Although the irradiation impairs the on resistance $RDS_{on}$, the blocking capability or the threshold voltage of the semiconductor component, this can be compensated for in a very simple manner by suitably dimensioning the compensation structures, in particular, the doping ratios of the depletion zones 105 and the complementary depletion zones 104. Although the scattering centers or defects 123 are provided in the entire compensation layer 108 in the example in FIG. 6, in many cases it also suffices to provide them only in the n-doped complementary depletion zones 104 and/or only in regions of the compensation layer 108 near the surface.

Compensation components are based on the principle that when a reverse voltage is applied, the free charge carriers of the n-and p-doped regions 104; 105 within the compensation layer 108 are more or less mutually depleted and are thus compensated. The advantage of compensation components is that in forward operation, they have a significantly reduced on resistance $RDS_{on}$ compared with conventional semiconductor components without compensation structures, for the same blocking characteristic.

Figure 7:
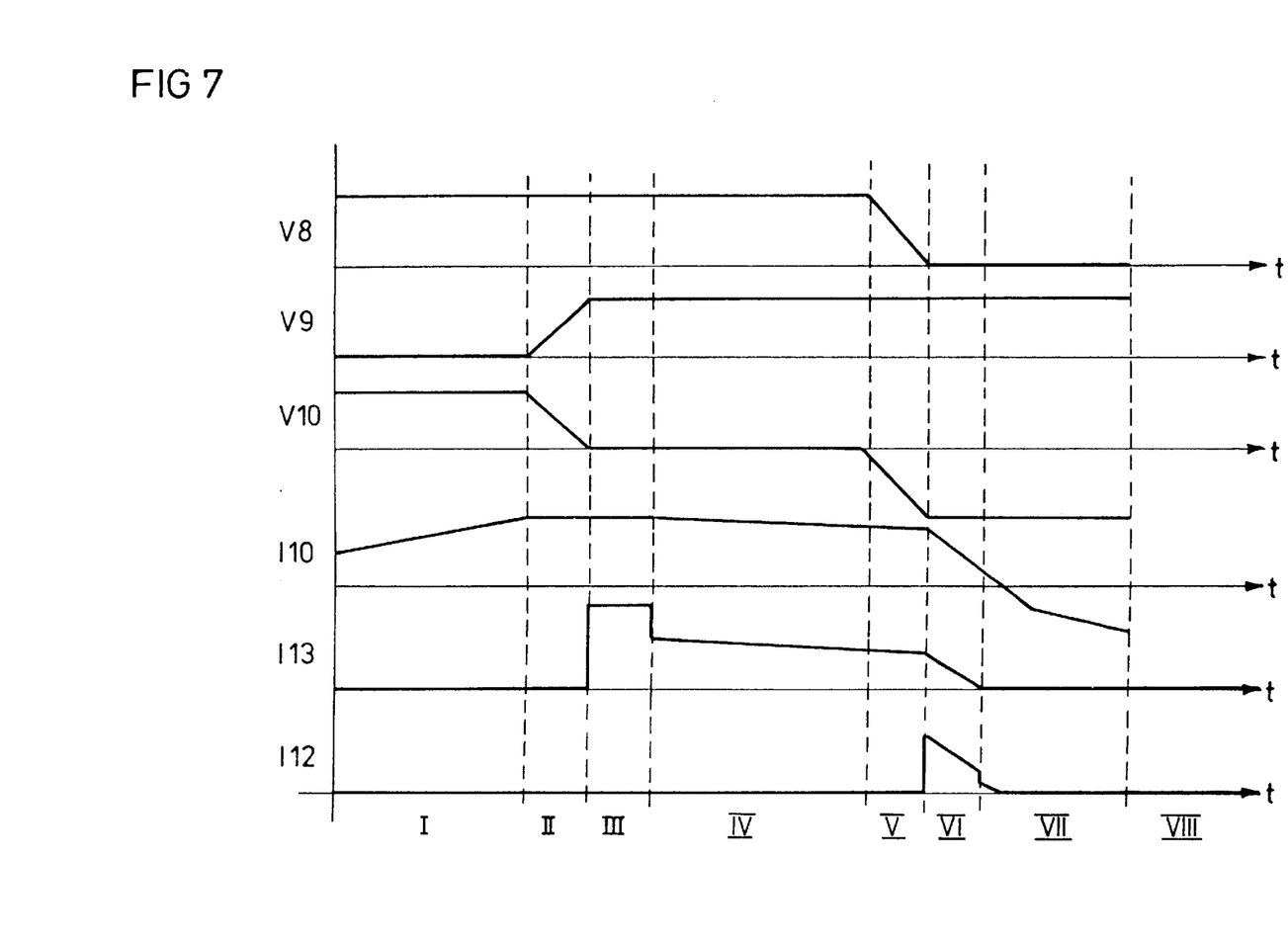
FIG. 7 is a signal/time diagram for the inventive full bridge circuit.

The method of operation of the full-bridge shown in FIG. 1 which has a compensation semiconductor component in accordance with one of FIGS. 3–5, is explained in more detail below using the signal/time diagram in FIG. 7.

In phase I, the MOSFETs 4, 7 are in the switched-on state, i.e. the positive supply potential V8=V2 is present at the output 8, while at the other output 9 the potential V9=V3= 0V. Consequently, a voltage V10 is present across the inductance 10, the voltage corresponding to the entire supply voltage V10=V2−V3=V2. In the event of resonant, i.e. load-relieved, switching, first the MOSFET 7 is turned off (phase II). The energy stored by the inductance 10 is output in the form of a current I10 and increases the potential V9 until the diode 13 turns on and takes up the entire primary current I10=I13 (phase III). Shortly afterward, the MOSFET 6 is switched on. The MOSFET 6 is switched on in a voltage-relieved manner, since the voltage dropped across its load path is virtually zero. The primary current I10 then flows through the channel of the MOSFET 6 that has formed. The potentials V8, V9 at the respective outputs 8, 9 are identical and correspond to the positive supply potential, i.e. V8=V9=V2. The voltage V10 dropped across the inductance 10 is thus zero (phase IV).

Afterward, the MOSFET 4 is turned off (phase V). What is essential for a voltage-relieved characteristic is that the MOSFET 4 is turned off so rapidly that its channel current is pinched off more rapidly than its drain-source voltage V2−V8 can rise. As a result of the turn-off of the MOSFET 4, the potential V8 falls slowly relative to the negative supply potential V3. The direction of the current I10 rotates, the current I10=I12 first flows through the diode 12 (phase VI) before the MOSFET 5 is completely switched on (phase VII). In this phase, the entire load current I10 flows in each case through the two MOSFETs 5, 6. The diode currents I12, I13 of these MOSFETs 5, 6 are thus zero. If the MOSFET 5 is switched off again, then the potential V8 rises again, while equally the potential V9 falls (phase VIII).

According to the invention, there is no occurrence here of a second breakdown or latch-up effect, as typically occurs in MOSFETs in prior art full-bridge circuits, as has already been set forth in detail in the introduction. The reason for this resides in a structural alteration of the MOSFET topology. By using a compensation component, it is possible, despite a comparatively high injected storage charge $Q_{rr}$ and a high recovery time $t_{rr}$, to avoid the destruction mechanism described in the introduction. This shall be explained using the diagrammatic partial sectional view in FIG. 8.

Figure 8:
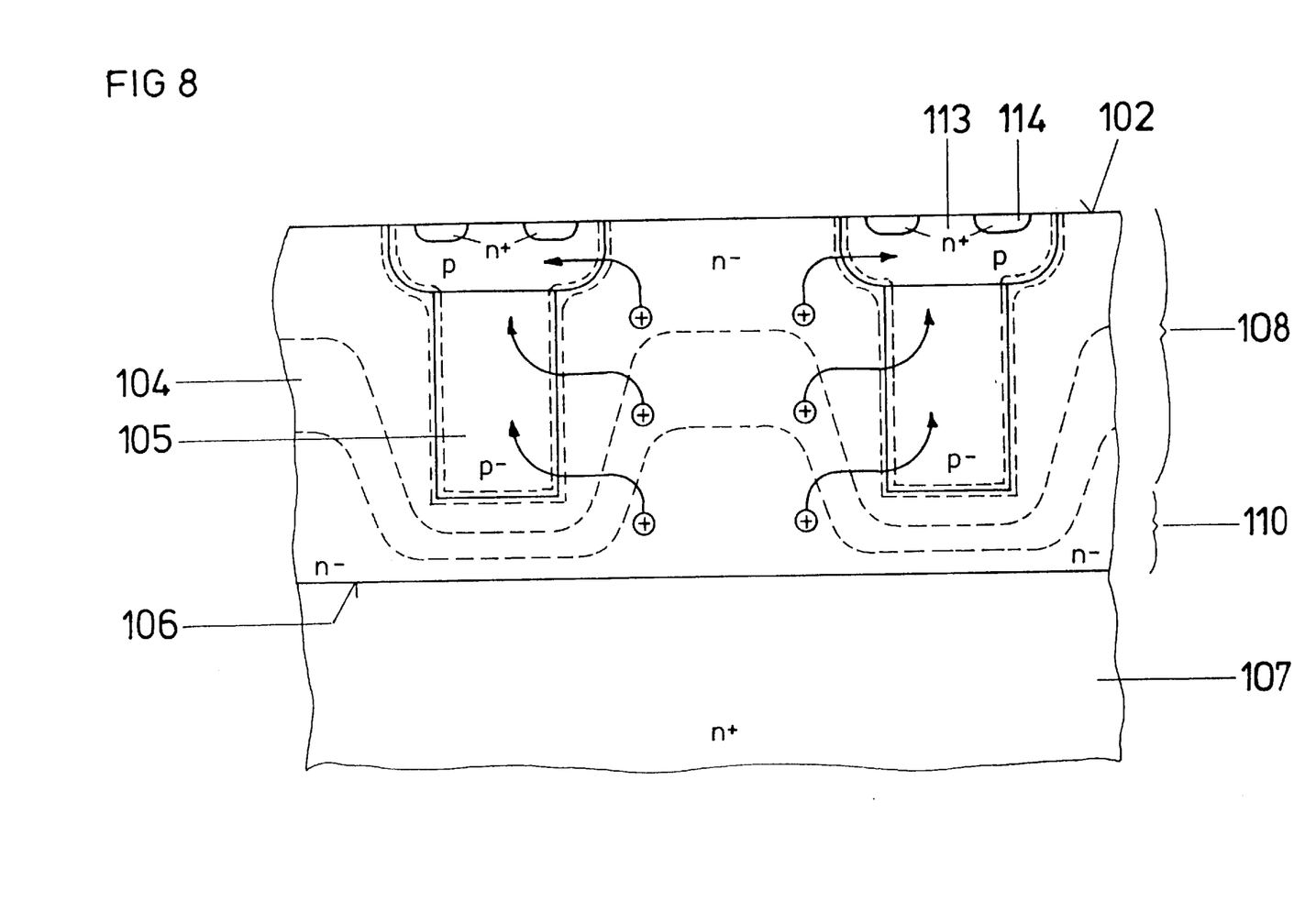
FIG. 8 is a diagrammatic partial sectional view of the MOSFET structure for illustrating the method of operation thereof.

In the reverse operation of the MOSFET 5, a high storage charge accumulates in the compensation layer 108 thereof. The sum of the storage charges $Q_{rr}$ essentially depends on the doping concentration in the compensation layer 108 and on the efficiency of the regions 107, 113 functioning as an emitter. The depletion zones 105 and the complementary depletion zones 104 which are arranged alternately next to one another define deep pn junctions 124 within the compensation layer. These pn junctions have the following effect: when a small forward voltage is applied, for example, during the switch-off operation of the semiconductor component, the storage charge $Q_{rr}$ injected into the compensation layer 108 is removed at least in that region that is reached by the deep pn junctions 124 and thus by the regions 104, 105. By virtue of the fact that the compensation layer 108 is permeated by regions 104, 105 to the greatest possible extent, the storage charge is virtually completely removed in the forward operation of the semiconductor component even in the case of very small electric fields. If the MOSFET is turned off, then the space charge zone (dashed lines) extends into the depth of the compensation layer 108 in a known tanner as the voltage increases. Since the storage charge is now no longer or virtually no longer present in the compensation layer 108, however, a large hole displacement current (arrows) does not arise, and consequently, nor does a switch-on of a parasitic bipolar transistor, as a result of which, the undesirable latch-up effect does not happen.

Furthermore, the large surface of the pn junctions 124 projecting into the depth of the semiconductor body 101 acts as a very large output capacitance that brakes an undesirably rapid rise in the drain-source voltage. These output capacitances 15–18 are very important in a ZVS circuit for buffering the voltage during switch-off. In an advantageous manner, the output capacitances 15–18 are formed as capacitors and each have a high capacitance in the range between 40 $pF/mm^2$ and 100 $pF/mm^2$ at a voltage of 25 V present at the plates of the capacitor.

In contrast to conventional MOSFETs, the space charge zone in compensation components already reaches the interface 106 between the drift zone 110 and the drain zone 107 at relatively low voltages, for example, at about 50 V. As a result, however, storage charge can no longer be held in this rear region of the semiconductor component either.

On account of the deep pn junctions 124, the compensation component also advantageously has a built-in electric field which more or less locally separates the electrons and holes from one another. Thus, the holes are focused in a region that is approximately perpendicular to the depletion zones 105, and this region is formed from the body zones 113 and the source zones 114. As a result, the holes (arrows) preferably do not flow laterally into the body zone 113 and below the source zone 114 to the source terminal, as a result of which, because of the lack of current density in this critical region, the triggering of the parasitic bipolar transistor is additionally made more difficult. Thus, by virtue of the inventive structure, the hole displacement current in the forward operation is focused below the contact hole of the source electrode 118, and consequently, does not lead to high current densities precisely in the critical region below the source zones 114, as is the case with a prior art MOSFET.

The invention shall not be restricted exclusively to the semiconductor structures shown in FIGS. 3–6. Rather, a multiplicity of new component variants can be specified there, for example, by interchanging the conductivity types n for p and by varying the doping concentration. With regard to further exemplary embodiments of a compensation component, reference is made to the already mentioned documents U.S. Pat. Nos. 5,216,275, 4,754,310, International Publication WO 97/29518, Issued German Patent DE 43 09 764 C2 and Issued German Patent DE 198 40 032 C1, the entire contents of which are herein incorporated by reference.

In addition to the abovementioned circuit application shown in FIGS. 1 and 2, a multiplicity of further applications could be found, of course, for the compensation component. The invention is suitable in particular in all circuits in which voltage-relieved switching is advantageous, such as, for example, switched-mode power supplies, half- or full-bridge circuits, rectifier or inverter circuits, voltage regulators, power supply, lamp drive circuits and the like.

The present invention has been set forth using the present description in such a way as to clarify the principle of the invention and its practical application as well as possible. It goes without saying that the present invention can be realized in a suitable manner in manifold embodiments and modifications within the scope of expert action and knowledge.

I claim:

1. A circuit configuration for load-relieved switching, comprising:

a terminal for receiving a first supply potential;

a terminal for receiving a second supply potential;

a bridge circuit having at least two controllable power switches, said two controllable power switches having controlled paths configured in series with one another and between said first supply potential and said second supply potential, said bridge circuit having output terminals;

a drive circuit for driving said two controllable power switches; and an inductive element connected to said output terminals of said bridge circuit;

at least one of said two controllable power switches being designed as a field-effect-controllable, integrated transistor in accordance with a charge carrier compensation principle.

2. The circuit configuration according to claim 1, wherein:

each of said two controllable power switches is designed as an enhancement-mode MOSFET.

3. The circuit configuration according to claim 1, wherein:

each of said two controllable power switches is designed as a MOSFET.

4. The circuit configuration according to claim 3, wherein: said MOSFET is a vertical MOSFET.

5. The circuit configuration according to claim 3, wherein:

said MOSFET has a controlled path defined by one of said controlled paths; and said MOSFET has an integrated diode and an integrated capacitive element that are connected in parallel with one another and with said controlled path of said MOSFET.

6. The circuit configuration according to claim 5, wherein:

said capacitive element is a capacitor having plates; and said capacitor has a high capacitance between 40 $pF/mm^2$ and 100 $pF/mm^2$ when a voltage of 25 V is present at said plates of said capacitor.

7. The circuit configuration according to claim 1, comprising:
  a semiconductor body, said field-effect-controllable, integrated transistor being configured in said semiconductor body;
  at least one compensation layer configured in said semiconductor body, said compensation layer having at least one depletion zone of a first conduction type and at least one complementary depletion zone of a second, opposite conduction type, said depletion zone and said complementary depletion zone adjoining each other and forming a deep pn junction;
  at least one body zone of the first conduction type being embedded in said compensation layer;
  at least one source zone of the second conduction type being embedded in said body zone; and
  at least one gate electrode for forming a current-carrying channel in said body zone when a gate potential is applied to said gate electrode.

8. The circuit configuration according to claim 7, wherein:
  said compensation layer has a plurality of depletion zones of the first conduction type and a plurality of complementary depletion zones of the second conduction type;
  said plurality of said complementary depletion zones have a total quantity of doping; and
  said plurality of said depletion zones have a total quantity of doping approximately corresponding to said total quantity of said doping of said plurality of said complementary depletion zones.

9. The circuit configuration according to claim 7, wherein:
  said compensation layer has a plurality of depletion zones of the first conduction type and a plurality of complementary depletion zones of the second conduction type; and
  said plurality of said complementary depletion zones and said plurality of said depletion zones are configured alternately next to one another in said compensation layer.

10. The circuit configuration according to claim 7, wherein:
  said depletion zone adjoins said base zone.

11. The circuit configuration according to claim 7, comprising:
  at least one drain zone of the second conduction type;
  said drain zone being connected to said compensation layer;
  said complementary depletion zone having a doping concentration; and
  said drain zone having a doping compensation being greater than said doping concentration in said complementary depletion zone.

12. The circuit configuration according to claim 11, comprising:
  a drift zone of the second conduction type located between said drain zone and said compensation layer;
  said drift zone having a doping concentration being less than said doping concentration of said drain zone.

13. The circuit configuration according to claim 7, comprising:
  a device for lifetime lowering;
  said device being provided in an element selected from a group consisting of said compensation layer and said drift zone; and
  said device reducing free charge carriers.

14. The circuit configuration according to claim 13, wherein:
  said device for lifetime lowering is designed as a feature selected from a group consisting of scattering centers and radiation damage that is produced by performing a process selected from a group consisting of irradiation and implantation.

15. The circuit configuration according to claim 1, wherein:
  said bridge circuit is designed as a full bridge; and
  said bridge circuit has two further controllable power switches, said two further controllable power switches have controlled paths configured in series with one another and between said first supply potential and said second supply potential.

16. The circuit configuration according to claim 1, comprising:
  a transformer having a primary-side inductance;
  said inductive element forming said primary-side inductance of said transformer.

17. The circuit configuration according to claim 1, wherein:
  said bridge circuit forms a component of a circuit selected from a group consisting of a switched-mode power supply, a pulsed power supply, a voltage regulator, and a lamp drive circuit.

18. The circuit configuration according to claim 17, comprising:
  a transformer having a primary inductance formed by said inductive element and a secondary inductance;
  a primary-side circuit and a secondary-side circuit being inductively coupled by said primary inductance and said secondary inductance;
  said primary inductance being configured in said primary-side circuit;
  said secondary inductance being configured in said secondary-side circuit; and
  said bridge circuit being for pulse switching power provided on said primary-side circuit to said secondary-side circuit.

19. A circuit configuration for load-relieved switching, comprising:
  a terminal for receiving a first supply potential;
  a terminal for receiving a second supply potential;
  a bridge circuit having at least two controllable power switches, said two controllable power switches having controlled paths configured in series with one another and between said first supply potential and said second supply potential, said bridge circuit having output terminals;
  a drive circuit for driving said two controllable power switches; and
  an inductive element connected to said output terminals of said bridge circuit;
  said two controllable power switches being designed as transistors with deep pn junctions.

20. The circuit configuration according to claim 19, wherein:
  each of said two controllable power switches is designed as an enhancement-mode MOSFET.

21. The circuit configuration according to claim 19, wherein:
  each of said two controllable power switches is designed as a MOSFET.

22. The circuit configuration according to claim 21, wherein:
said MOSFET is a vertical MOSFET.

23. The circuit configuration according to claim 21, wherein:
said MOSFET has a controlled path defined by one of said controlled paths; and
said MOSFET has an integrated diode and an integrated capacitive element that are connected in parallel with one another and with said controlled path of said MOSFET.

24. The circuit configuration according to claim 23, wherein:
said capacitive element is a capacitor having plates; and
said capacitor has a high capacitance between 40 pF/mm$^2$ and 100 pF/mm$^2$ when a voltage of 25 V is present at said plates of said capacitor.

25. The circuit configuration according to claim 19, comprising:
a semiconductor body, said two-controllable power switches being configured in said semiconductor body;
at least one compensation layer configured in said semiconductor body, said compensation layer having at least one depletion zone of a first conduction type and at least one complementary depletion zone of a second, opposite conduction type, said depletion zone and said complementary depletion zone adjoining each other and forming a deep pn junction;
at least one body zone of the first conduction type being embedded in said compensation layer;
at least one source zone of the second conduction type being embedded in said body zone; and
at least one gate electrode for forming a current-carrying channel in said body zone when a gate potential is applied to said gate electrode.

26. The circuit configuration according to claim 25, wherein:
said compensation layer has a plurality of depletion zones of the first conduction type and a plurality of complementary depletion zones of the second conduction type;
said plurality of said complementary depletion zones have a total quantity of doping; and
said plurality of said depletion zones have a total quantity of doping approximately corresponding to said total quantity of said doping of said plurality of said complementary depletion zones.

27. The circuit configuration according to claim 25, wherein:
said compensation layer has a plurality of depletion zones of the first conduction type and a plurality of complementary depletion zones of the second conduction type; and
said plurality of said complementary depletion zones and said plurality of said depletion zones are configured alternately next to one another in said compensation layer.

28. The circuit configuration according to claim 25, wherein:
said depletion zone adjoins said base zone.

29. The circuit configuration according to claim 25, comprising:
at least one drain zone of the second conduction type;
said drain zone being connected to said compensation layer;
said complementary depletion zone having a doping concentration; and
said drain zone having a doping compensation being greater than said doping concentration in said complementary depletion zone.

30. The circuit configuration according to claim 29, comprising:
a drift zone of the second conduction type located between said drain zone and said compensation layer;
said drift zone having a doping concentration being less than said doping concentration of said drain zone.

31. The circuit configuration according to claim 25, comprising:
a device for lifetime lowering;
said device being provided in an element selected from a group consisting of said compensation layer and said drift zone; and
said device reducing free charge carriers.

32. The circuit configuration according to claim 31, wherein:
said device for lifetime lowering is designed as a feature selected from a group consisting of scattering centers and radiation damage that is produced by performing a process selected from a group consisting of irradiation and implantation.

33. The circuit configuration according to claim 19, wherein:
said bridge circuit is designed as a full bridge; and
said bridge circuit has two further controllable power switches, said two further controllable power switches have controlled paths configured in series with one another and between said first supply potential and said second supply potential.

34. The circuit configuration according to claim 19, comprising:
a transformer having a primary-side inductance;
said inductive element forming said primary-side inductance of said transformer.

35. The circuit configuration according to claim 19, wherein:
said bridge circuit forms a component of a circuit selected from a group consisting of a switched-mode power supply, a pulsed power supply, a voltage regulator, and a lamp drive circuit.

36. The circuit configuration according to claim 35, comprising:
a transformer having a primary inductance formed by said inductive element and a secondary inductance;
a primary-side circuit and a secondary-side circuit being inductively coupled by said primary inductance and said secondary inductance;
said primary inductance being configured in said primary-side circuit;
said secondary inductance being configured in said secondary-side circuit; and
said bridge circuit being for pulse switching power provided on said primary-side circuit to said secondary-side circuit.

* * * * *